(12) United States Patent
Yamada et al.

(10) Patent No.: US 10,586,777 B2
(45) Date of Patent: Mar. 10, 2020

(54) SEMICONDUCTOR DEVICE AND METHOD OF MANUFACTURING THE SAME

(71) Applicant: Renesas Electronics Corporation, Koutou-ku, Tokyo (JP)

(72) Inventors: Kentaro Yamada, Ibaraki (JP); Shigeki Tomaru, Tokyo (JP); Taketoshi Fukushima, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/844,223

(22) Filed: Dec. 15, 2017

(65) Prior Publication Data

US 2018/0108629 A1    Apr. 19, 2018

Related U.S. Application Data

(62) Division of application No. 15/004,983, filed on Jan. 24, 2016, now abandoned.

(30) Foreign Application Priority Data

Feb. 18, 2015   (JP) .................................. 2015-029409

(51) Int. Cl.
*H01L 23/00*   (2006.01)
*H01L 23/528*  (2006.01)

(52) U.S. Cl.
CPC .......... *H01L 24/06* (2013.01); *H01L 23/5286* (2013.01); *H01L 24/03* (2013.01);
(Continued)

(58) Field of Classification Search
CPC ..... H01L 24/06; H01L 24/05; H01L 23/5286; H01L 24/46; H01L 24/85;
(Continued)

(56) References Cited

U.S. PATENT DOCUMENTS 6,362,087 B1   3/2002  Wang et al.
6,400,019 B1   6/2002  Hirashima et al.
(Continued)

FOREIGN PATENT DOCUMENTS

JP   H06-333974 A   12/1994
JP   10-056030 A    2/1998
(Continued)

OTHER PUBLICATIONS

Extended European Search Report, dated Aug. 11, 2016, in European Patent Application No. 16156318.4.
(Continued)

*Primary Examiner* — Marc Anthony Armand
*Assistant Examiner* — Sue Tang
(74) *Attorney, Agent, or Firm* — Shapiro, Gabor and Rosenberger, PLLC

(57) ABSTRACT

To improve the reliability of a semiconductor device.
The semiconductor device includes a plurality of wiring layers formed on a semiconductor substrate, a pad formed on an uppermost wiring layer of the plurality of wiring layers, a surface protection film which includes an opening on the pad and is made of an inorganic insulating film, a rewiring formed on the surface protection film; a pad electrode formed on the rewiring, and a wire connected to the pad electrode. The rewiring includes a pad electrode mounting portion on which the pad electrode is mounted, a connection portion which is connected to the pad, and an extended wiring portion which couples the pad electrode mounting portion and the connection portion, and the pad electrode mounting portion has a rectangular shape when seen in a plan view.

5 Claims, 12 Drawing Sheets

(52) U.S. Cl.
CPC .............. *H01L 24/05* (2013.01); *H01L 24/85* (2013.01); *H01L 23/562* (2013.01); *H01L 24/45* (2013.01); *H01L 24/48* (2013.01); *H01L 24/49* (2013.01); *H01L 2224/0347* (2013.01); *H01L 2224/03462* (2013.01); *H01L 2224/03914* (2013.01); *H01L 2224/04042* (2013.01); *H01L 2224/05008* (2013.01); *H01L 2224/05147* (2013.01); *H01L 2224/05155* (2013.01); *H01L 2224/05553* (2013.01); *H01L 2224/05564* (2013.01); *H01L 2224/05644* (2013.01); *H01L 2224/45147* (2013.01); *H01L 2224/45565* (2013.01); *H01L 2224/45664* (2013.01); *H01L 2224/48247* (2013.01); *H01L 2224/48463* (2013.01); *H01L 2224/48844* (2013.01); *H01L 2224/49175* (2013.01); *H01L 2224/78301* (2013.01); *H01L 2224/85181* (2013.01); *H01L 2224/85206* (2013.01); *H01L 2924/00012* (2013.01); *H01L 2924/00014* (2013.01); *H01L 2924/10162* (2013.01); *H01L 2924/10253* (2013.01); *H01L 2924/1306* (2013.01); *H01L 2924/181* (2013.01); *H01L 2924/35121* (2013.01)

(58) Field of Classification Search
CPC .............. H01L 23/49811; H01L 24/03; H01L 23/49894; H01L 2924/00012; H01L 24/49; H01L 2224/49175; H01L 2924/00014; H01L 2924/10162
See application file for complete search history.

(56) References Cited

U.S. PATENT DOCUMENTS

| | | |
|---|---|---|
| 2002/0074656 A1 | 6/2002 | Ujiie et al. |
| 2010/0164105 A1 | 7/2010 | Onai et al. |
| 2010/0295043 A1* | 11/2010 | Yasumura ............... H01L 24/05 257/48 |
| 2011/0169170 A1* | 7/2011 | Baba ................. H01L 23/49822 257/774 |
| 2011/0304049 A1* | 12/2011 | Shigihara .......... H01L 23/53238 257/762 |
| 2012/0164795 A1* | 6/2012 | Sekihara ............. H01L 23/3114 438/123 |
| 2012/0193787 A1 | 8/2012 | Maitani et al. |

FOREIGN PATENT DOCUMENTS

| | | |
|---|---|---|
| JP | 2001-210668 A | 8/2001 |
| JP | 2002-170826 A | 6/2002 |
| JP | 2005-223123 A | 8/2005 |
| JP | 2010-147051 A | 7/2010 |
| JP | 2010-171386 A | 8/2010 |
| JP | 2012-004210 A | 1/2012 |
| JP | 2012-138476 A | 7/2012 |
| KR | 2007-0032468 A | 3/2007 |

OTHER PUBLICATIONS

Office Action, dated Sep. 4, 2018, in Japanese Patent Application No. 2015-029409.
Office Action, dated Jun. 21, 2019, in Taiwanese Patent Application No. 104141916.
Office Action dated Aug. 30, 2019, in Chinese Patent Application No. 201610090985.0.
Office Action dated Oct. 15, 2019, in European Patent Application No. 16156318.4.

* cited by examiner

SEMICONDUCTOR DEVICE AND METHOD OF MANUFACTURING THE SAME

CROSS-REFERENCE TO RELATED APPLICATION

The present application claims priority from Japanese Patent Application No. 2015-029409 filed on Feb. 18, 2015, the content of which is hereby incorporated by reference into this application.

TECHNICAL FIELD OF THE INVENTION

The present invention relates to a semiconductor device and a method of manufacturing the same, and particularly to a technique effective when applied to a semiconductor device having a rewiring configured using a metal film on each top of a plurality of wiring layers formed on a main surface of a semiconductor substrate, and a method of manufacturing the same.

BACKGROUND OF THE INVENTION

In semiconductor devices, for example, a plurality of wiring layers formed of a metal film containing copper (Cu) or aluminum (Al) as a main component are formed on a top of a semiconductor substrate on which a semiconductor element such as a complementary metal insulator semiconductor (CMIS) transistor is formed, and a bonding pad (pad) is formed on a part of the uppermost wiring layer among the plurality of wiring layers. Further, a bonding wire or the like is connected to the bonding pad.

Japanese Patent Application Laid-Open Publication No. 2001-210668 (Patent Document 1) discloses a semiconductor device in which a plurality of rectangular pads 2a are arranged on a front surface of a semiconductor chip 2. Each of the rectangular pads 2a extends in a lateral direction with respect to the arrangement direction, and a wire 7 is connected to the pad 2a.

The abstract of Japanese Patent Application Laid-Open Publication No. H6(1994)-333974 (Patent Document 2) discloses a technique of forming a bonding pad provided along a side edge of an integrated circuit in a rectangular shape having a long side in an ultrasonic vibration direction at the time of wire bonding.

SUMMARY OF THE INVENTION

A semiconductor device having a rewiring that has been studied by the inventors of the present application includes a semiconductor chip, a wire which is connected to the semiconductor chip, and a sealing body which seals the semiconductor chip and the wire. The semiconductor chip includes a semiconductor element, and a wiring electrically connected to the semiconductor element, and a rewiring having a resistance significantly lower than that of the wiring connected to the semiconductor element, and the sealing body includes a plurality of external terminals. Further, the plurality of external terminals are electrically connected to the rewiring of the semiconductor chip via the wire.

The inventors of the present application have recognized a problem that the wire is peeled off from the semiconductor chip at a phase of studying miniaturization of the semiconductor chip (chip size). That is, it has been found out that reliability of the semiconductor device deteriorates.

Accordingly, there is a demand for a technique of improving the reliability of the semiconductor device in the semiconductor device having the rewiring.

The above and other objects and novel characteristics of the present invention will be apparent from the description of the present specification and the accompanying drawings.

A semiconductor device according to an embodiment includes a plurality of wiring layers formed on a semiconductor substrate, a pad formed on an uppermost wiring layer of the plurality of wiring layers, a surface protection film which includes an opening on the pad and is made of an inorganic insulating film, a rewiring formed on the surface protection film, a pad electrode formed on the rewiring, and a wire connected to the pad electrode. The rewiring includes a pad electrode mounting portion on which the pad electrode is mounted, a connection portion which is connected to the pad, and an extended wiring portion which couples the pad electrode mounting portion and the connection portion, and the pad electrode mounting portion has a rectangular shape when seen in a plan view.

According to one embodiment of the present invention, it is possible to improve the reliability of the semiconductor device having the rewiring.

BRIEF DESCRIPTIONS OF THE DRAWINGS

DESCRIPTIONS OF THE PREFERRED EMBODIMENTS

Figure 1:
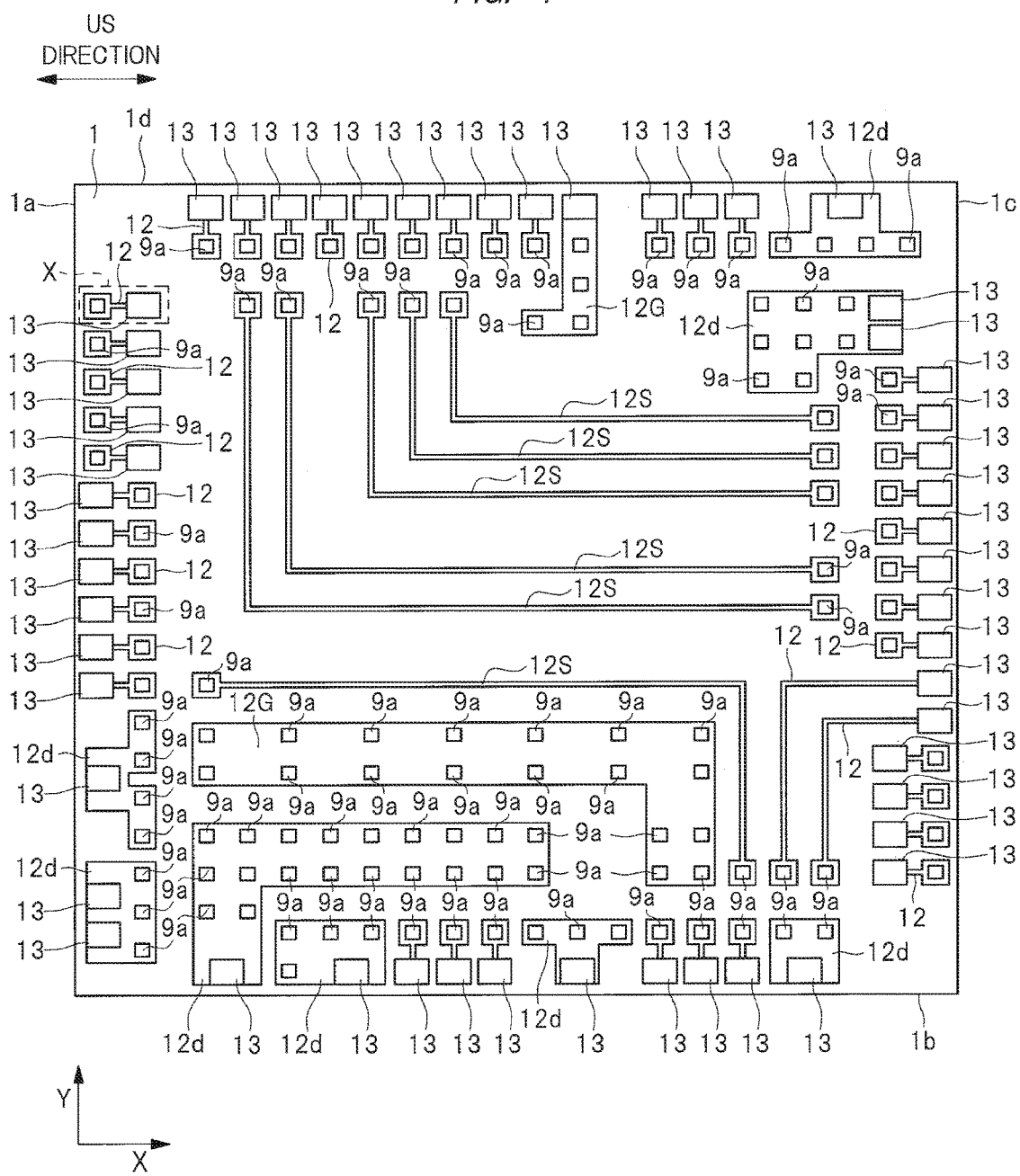
FIG. 1 is an overall plan view of a semiconductor chip in which a semiconductor device according to an embodiment of the present invention is formed.

In the following embodiment, when there is the necessity for convenience, the explanation will be divided into plural sections or plural embodiments. However, unless otherwise specified, they are not irrelevant with each other but they have a relationship that one is a modification example, an application, detailed explanation, and supplementary explanation of a part or all of the other. In the following embodiment, when the number of elements, etc. (including the number, a numeric value, quantity, a range, etc.) is referred to, the number of elements may be not restricted to a specific number but may be more than or less than the specific number, except for the case where it is specified in particular or clearly restricted to the specific number in principle.

In the following embodiment, a component (including an element step etc.) referred to is not always essential, except for the case where it is specified in particular or clearly considered to be essential in principle. Similarly, in the following embodiment, when referring to the shape, positional relationship, etc. of a component etc, what is analogous or similar substantially to the shape, positional relationship etc. shall be included, except for the case where it is specified in particular or clearly not considered to be so in principle. The same applies to the number of elements (including the number, a numeric value, quantity, a range, etc.) described above.

Hereinafter, embodiments of the present invention will be explained in detail with reference to the accompanying drawings. In the entire diagrams for explaining the embodiments of the present invention, the same or a related symbol is attached to the member which has the same function, and the repeated explanation thereof is omitted. When plural similar members (regions) exist, an individual or specific region may be indicated by adding a mark to the symbol of a generic name. In the following embodiments, except when necessary in particular, the repeated explanation of the same or a similar part is omitted in principle.

In a drawing employed in the embodiments, even if it is a sectional view, hatching may be omitted in order to make the drawing easier to see. Even if the drawing is a plan view, hatching may be attached on the contrary in order to make the drawing easier to see.

In a sectional view and a plan view, the size of each region does not correctly correspond to an actual device, and a specific region may be displayed relatively larger in order to make the drawing easier to see. Even when a plan view and a sectional view correspond to each other, each region may be displayed in a different size.

(Embodiment)

First, a description will be given regarding a semiconductor device having a rewiring that has been studied by the inventors of the present application.

The semiconductor device that has been studied by the inventors of the present application includes a semiconductor chip, a wire to be connected to the semiconductor chip, and a sealing body that seals the semiconductor chip and the wire. The semiconductor chip includes a plurality of semiconductor elements; a wiring formed of multilayer wiring layer that electrically connects the plurality of semiconductor elements to each other; and a rewiring, which is electrically connected to the wiring, includes Cu as amain component, and has a resistance significantly lower than the wiring. Further, the rewiring is connected to a pad which is a part of the wiring formed on the uppermost wiring layer of the multilayer wiring layer. The wiring and the rewiring formed on the uppermost wiring layer are electrically separated from each other by a surface protection film that covers the uppermost wiring layer, but the rewiring is electrically connected to the pad of the wiring via an opening of the surface protection film provided so as to expose the pad. A pad electrode including an Au plating layer is formed on the rewiring in order to improve the connection reliability with the wire. When seen in a plan view, the rewiring includes a pad electrode mounting portion to mount the pad electrode thereon, an extended wiring portion that extends from the pad electrode mounting portion, and a connection portion that is connected to the pad which is the part of the wiring, and the pad electrode mounting portion has a square shape.

In addition, a plurality of external terminals (outer leads, solder balls or the like) are formed in the sealing body, and the external terminals are connected to internal terminals (inner leads or conductor layers provided on a package substrate) inside the sealing body. Further, one end of the wire is connected to the pad electrode provided on the rewiring in a wire bonding process, and the other end of the wire is connected to the internal terminal of the sealing body. In the wire bonding process, a spherical ball is formed at a tip end of the wire, and ultrasonic vibration is applied to the wire (that is, the ball) to connect the ball to the pad electrode while rubbing.

The pad electrode covers the pad electrode mounting portion of the rewiring, and extends to a side wall of the rewiring. When seen in a plan view, the pad electrode also has a square shape, and one side thereof is slightly larger than a ball diameter while the pad electrode and the pad electrode mounting portion are formed to be as small as possible such that the connection portion of the wire does not protrude from the pad electrode. The reason is that the reduction in size of the pad electrode is effective for miniaturization of the semiconductor chip because there are a number of the pad electrodes inside the semiconductor chip.

In addition, a surface protection film according to the conventional structure has a structure in which an inorganic insulating film such as a silicon nitride film and an organic insulating film such as a polyimide film are stacked, and the organic insulating film is interposed between the inorganic insulating film and a rewiring. However, it is necessary to dispose a pad electrode by being spaced apart for a predetermined distance from a pad opening of a surface protection film when the organic insulating film is present, which has become an obstacle to implementing the miniaturization of the semiconductor chip. That is, a film thickness of the organic insulating is larger than a film thickness of the inorganic insulating film, and a side wall of the pad opening has a tapered shape, thereby causing increase of the pad opening size when seen in a plan view. Thus, only the inorganic insulating film is provided as the surface protection film in the semiconductor device that has been studied by the inventors of the present application.

However, a problem that the rewiring below the pad electrode is peeled off from the surface protection film has occurred when the rewiring is formed on the surface protection film formed of the inorganic insulating film, and the pad electrode on the rewiring is subjected to the wire bonding.

With respect to such a problem, the inventors of the present application have the following presumption. Ultrasonic ball bonding is performed in the wire bonding process. That is, a pressing force (referred to as a normal stress) in a vertical direction to a front surface of the semiconductor chip and a pressing force (referred to as a horizontal stress) in a parallel direction to the front surface are applied to the ball of the wire tip end. Since these normal stress and horizontal stress are transferred to an interface between the surface protection film and the rewiring via the rewiring, the front surface of the surface protection film is damaged in a wire connection portion, and adhesion strength between the rewiring and the surface protection film deteriorates. In addition, a capillary that supports the wire is moved toward the internal terminal after completion of the wire connection with respect to the pad electrode in the wire bonding process, and at this time, the wire receives a tensile stress in the movement direction of the capillary. The wire and the rewiring are peeled off from the surface protection film in an integrated manner with a position below the wire connection portion as a start point due to the tensile stress.

In addition, it is also confirmed that a frequency of the peeling-off increases in a case in which the wire connection portion is deviated from a center of the pad electrode, and particularly, in the case of being deviated in a reverse direction to the extended wiring portion, and deviated to a position reaching an end portion of the pad electrode. It is presumed that the rewiring (and the pad electrode) is peeled off from the surface protection film since the adhesion strength between the rewiring and the surface protection film deteriorates in the end portion of the pad electrode, and the tensile stress is applied in a direction in which the portion is curled up.

Although the present embodiment copes with the above-described problem(s), a structure of a semiconductor device of the present embodiment is the same as the above-described structure of the semiconductor device that has been studied by the inventors of the present application, and the description thereof can be shared, so that there is also a part for which a description is omitted. In this enhanced embodiment, a shape of a pad electrode and a shape of a pad electrode mounting portion of a rewiring are mainly different from each other.

The semiconductor device (semiconductor integrated circuit device) according to the present embodiment and the following embodiments, for example, includes a semiconductor chip having a plurality of semiconductor elements, a plurality of wiring layers (multilayer wiring) formed on each top of the plurality of semiconductor elements, a plurality of rewirings connected to the uppermost wiring layer of the plurality of wiring layers, and the semiconductor device is configured by connecting the plurality of semiconductor elements to each other via the multilayer wiring and the plurality of rewirings.

<About Semiconductor Device>

Figure 2:
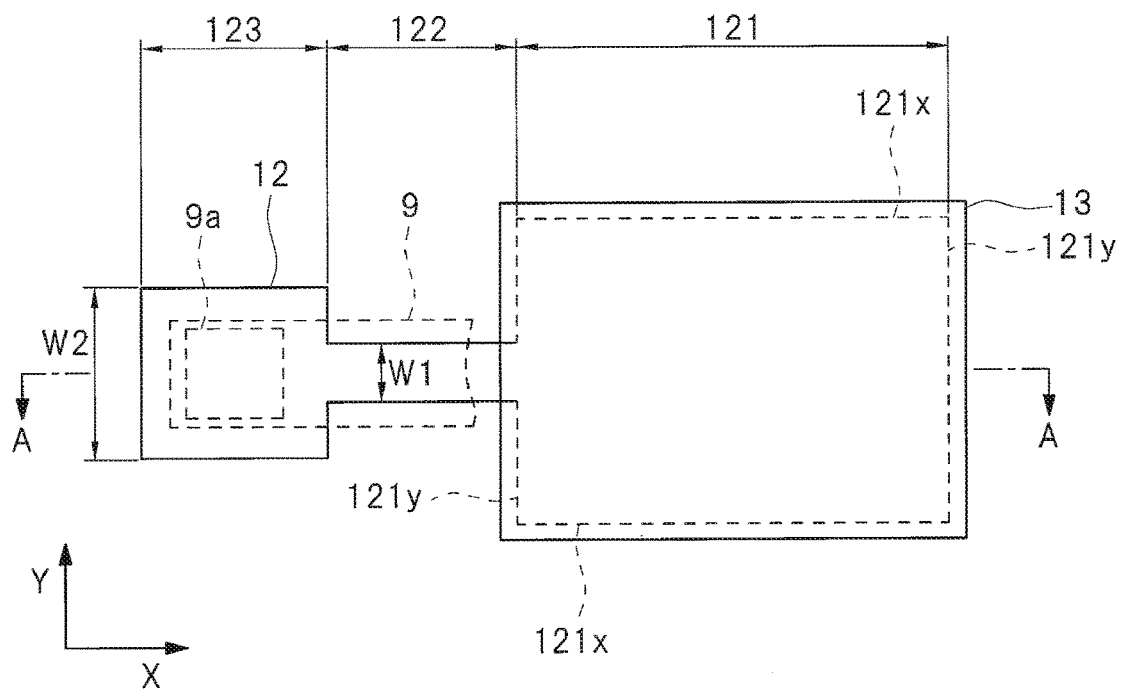
FIG. 2 is an enlarged plan view illustrating a part of FIG. 1.
Figure 3:
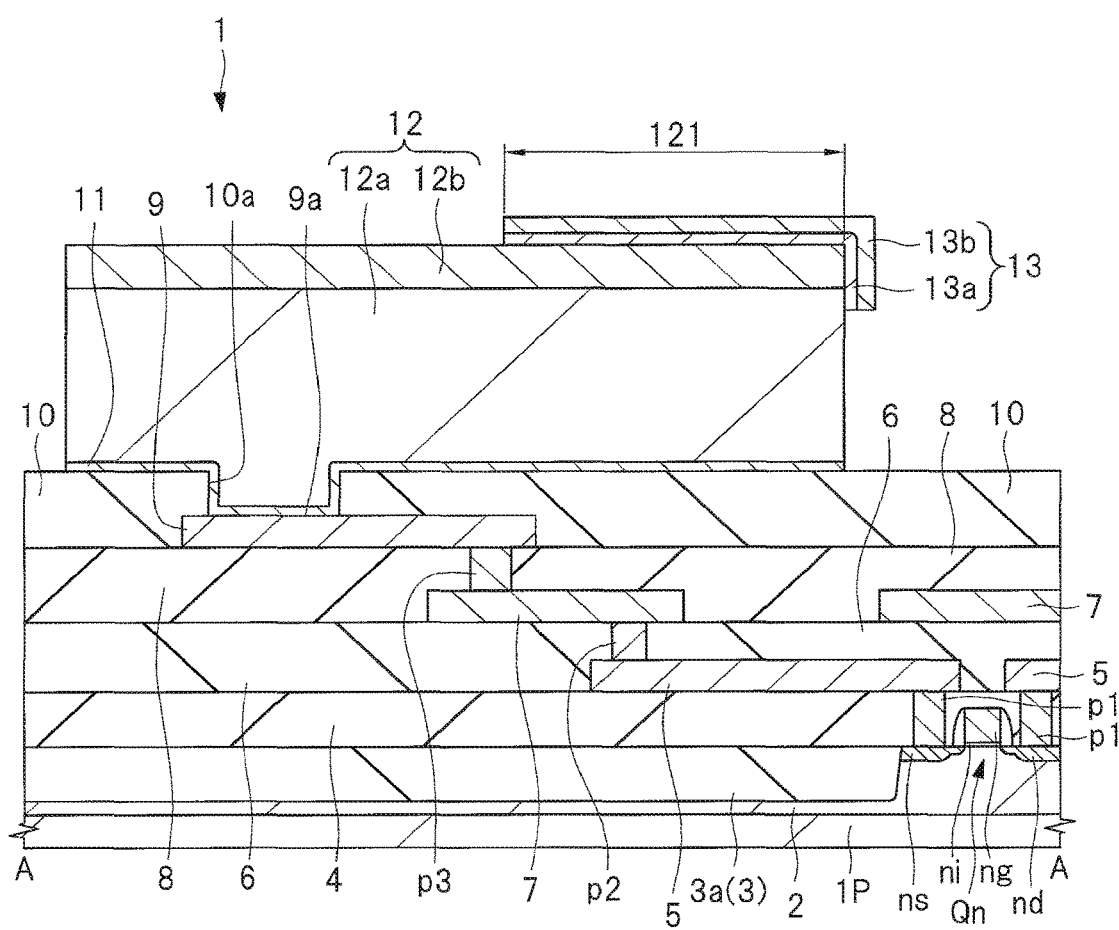
FIG. 3 is a cross-sectional view taken along a line A-A of FIG. 2.

FIG. 1 is a plan view illustrating an example of a semiconductor chip 1, FIG. 2 is an enlarged plan view of a region surrounded by a broken line X of FIG. 1, and FIG. 3 is a cross-sectional view taken along line a line A-A of FIG. 2.

FIG. 1 illustrates an example of a layout of rewirings 12, 12d, 12G and 12S formed on a device plane of the semiconductor chip 1 having a square (or rectangular) shape with four sides 1a, 1b, 1c and 1d. The rewirings 12, 12d, 12G and 12S have a film thickness and a wiring width larger than those of the plurality of wiring layers of the semiconductor chip 1 (a first-layer Al wiring 5, a second-layer Al wiring 7, and a third-layer Al wiring 9 illustrated in FIG. 3), and thus, has an extremely low impedance as compared to the plurality of wiring layers. The rewirings 12, 12d, 12G and 12S are used as follows. For example, the rewiring 12 is used for input and output of a signal, the rewirings 12d and 12G are used for supply of power (Vcc and GND), and the rewiring 12S is used for connection between internal circuits.

As illustrated in FIG. 1, the plurality of rewirings 12 configuring an external connection terminal of the semiconductor device are disposed in a peripheral portion of the semiconductor chip 1, a pad electrode 13 is formed at each one end of the rewirings 12, and the other end thereof is connected to a pad 9a formed on the uppermost wiring layer as illustrated in FIGS. 2 and 3. The pad electrodes 13 are disposed in a row along the respective sides 1a, 1b, 1c and 1d of the semiconductor chip 1 although not particularly limited. As a matter of course, the pad electrodes 13 may be disposed in a zigzag manner, or in three or more rows along the respective sides 1a, 1b, 1c and 1d of the semiconductor chip 1. There is a case in which the pad 9a is positioned at an inner side of the semiconductor chip 1 with respect to the pad electrode 13 as illustrated in FIG. 1, and there is a case in which the pad 9a is positioned at an outer side (each side of the sides 1a, 1b, 1c and 1d to which the pad electrode 13 is adjacent) of the semiconductor chip 1 with respect to the pad electrode 13.

In addition, the rewirings 12d and 12G illustrated in FIG. 1 are the rewirings for supply of power (Vcc and GND). Since the pad electrode 13 is formed at each one end of the rewirings 12d and 12G, and the other end is connected to the pad 9a formed on a power wiring inside the semiconductor chip 1, it is possible to supply a power (Vcc or GND) voltage supplied from the outside of the semiconductor chip 1 to a plurality of the power wirings inside the semiconductor chip 1 at low impedance.

In addition, the rewiring 12S illustrated in FIG. 1 is used as the wiring that connects circuits or elements formed in the semiconductor chip 1. Accordingly, the pad electrode 13 is not formed in the rewiring 12S. Both ends of the rewiring 12S are connected to the pad 9a formed on the uppermost wiring layer.

The pad electrode 13 disposed on the rewirings 12, 12d, 12G and 12S have a rectangular shape with short sides and long sides, and is disposed such that a direction of the long side matches an application direction (indicated as an US direction in FIG. 1) of an ultrasonic wave in the wire bonding process to be described later. As illustrated in FIG. 1, the entire long side of the pad electrodes 13 disposed along the four sides 1a, 1b, 1c and 1d matches the US direction.

FIG. 2 illustrates an enlarged plan view of the rewiring 12 for input and output of the signal. The rewiring 12 is configured of a pad electrode mounting portion 121, an extended wiring portion 122, and a connection portion 123. The pad electrode mounting portion 121 is a part on which the rectangular pad electrode 13 is mounted, and has a rectangular shape including long sides 121x and short sides 121y. The pad electrode mounting portion 121 may be formed in the substantially rectangular shape, and an intersection between the long side 121x and the short side 121y may be chamfered or rounded. The connection portion 123 is a part at which the rewiring 12 is connected to the pad 9a that is the part of the wiring 9. Further, the extended wiring portion 122 couples the pad electrode mounting portion 121 and the connection portion 123, and has a wiring width W1. The extended wiring portion 122 extends in a direction orthogonal to the short side 121y from the short side 121y, and the wiring width W1 of the extended wiring portion 122 is narrower (smaller) than a length of the short side 121y.

The connection portion 123 is formed in a square shape having a predetermined width W2. Although the wiring width W1 of the extended wiring portion 122 is smaller than the width W2 of the connection portion 123 in FIG. 2, both the widths may be equal to each other. The width W2 of the connection portion 123 is smaller than the length of the short side 121y of the pad electrode mounting portion 121.

A planar shape of the pad electrode 13 has a shape similar to that of the pad electrode mounting portion 121, and has an enlarged pattern of the pad electrode mounting portion 121. The pad electrode 13 covers an entire upper surface (front surface) of the pad electrode mounting portion 121, and also covers a part of a side surface so as to continuously extend to the side surface. The wiring 9 connected to the rewiring 12 extends toward the inner side of the semiconductor chip 1 in the connection portion 123.

As illustrated in FIG. 3, a p-type well 2 and an element isolation groove 3 are formed in a semiconductor substrate 1P made of p-type monocrystalline silicon, for example, and an element isolation insulating film 3a, which is made of, for example, a silicon oxide film, is embedded in an inside of the element isolation groove 3.

An n-channel MIS transistor (Qn) is formed in the p-type well 2. The n-channel MIS transistor (Qn) is formed in an active region defined by the element isolation groove 3, and includes a source region ns and a drain region nd formed in the p-type well 2, and a gate electrode ng formed on the p-type well 2 with a gate insulating film ni interposed therebetween. In addition, an n-type well is formed in the semiconductor substrate 1P, a p-channel MIS transistor is formed in the n-type well, and the p-channel MIS transistor includes a source region and a drain region, and a gate electrode formed on the n-type well with a gate insulating film interposed therebetween although not illustrated.

The wiring configured using a metal film, which connects the semiconductor elements (for example, the n-channel MIS transistor Qn or the p-channel MIS transistor) to each other, is formed on each top of the n-channel MIS transistor (Qn) and the p-channel MIS transistor. In general, the wiring that connects the semiconductor elements to each other has a multilayer wiring structure including about three layers or ten layers. FIG. 3 illustrates the wiring layers of the three layers (the first-layer Al wiring 5, the second-layer Al wiring 7, and the third-layer Al wiring 9) each of which is configured using the metal film containing an Al alloy as a main body as an example of the multilayer wiring. The wiring layer will be referred in the case of collectively indicating the plurality of wirings formed in the respective wiring layers. Each film thickness of the wiring layer is set such that the wiring layer as a second layer is thicker than the wiring layer as a first layer, and the wiring layer as a third layer is thicker than the wiring layer as the second layer.

Interlayer insulating films 4, 6 and 8, each of which is made of a silicon oxide film or the like, and plugs p1, p2 and p3, which electrically connect the wiring layers of the three layers to each other, are formed, respectively, between the n-channel MIS transistor (Qn) and the first-layer Al wiring 5, between the first-layer Al wiring 5 and the second-layer Al wiring 7, and the second-layer Al wiring 7 and the third-layer Al wiring 9.

The interlayer insulating film 4 is formed on the semiconductor substrate 1P so as to cover the semiconductor element, for example, and the first-layer Al wiring 5 is formed on the interlayer insulating film 4. The first-layer Al wiring 5 is electrically connected to the source region ns and the drain region nd of the n-channel MIS transistor (Qn) as the semiconductor element via the plug p1 formed in the interlayer insulating film 4, for example. The connection between the gate electrode ng and the first-layer Al wiring 5 is not illustrated.

The second-layer Al wiring 7 is electrically connected to the first-layer Al wiring 5 via the plug p2 formed in the interlayer insulating film 6, for example. The third-layer Al wiring 9 is electrically connected to the second-layer Al wiring 7 via the plug p3 formed in the interlayer insulating film 8, for example. The plugs p1, p2 and p3 are configured using a metal film, for example, a W (tungsten) film.

As a matter of course, the multilayer wiring (the three-layer wiring) may be formed using a dual damascene method in which the wiring and the plug are formed in an integrated manner in the case of being formed using the metal film containing Cu as the main body according to a chemical mechanical polishing method (CMP method). In addition, the interlayer insulating films 4, 6 and 8 are made of the silicon oxide film ($SiO_2$), but may be, of course, configured using a monolayer film or a stacked film of a silicon oxide film (SiOC film) containing carbon, a silicon oxide film (SiCON film) containing carbon and nitrogen, or a silicon oxide film (SiOF film) containing fluorine. In addition, the first layer and the second layer of the multilayer wiring may be formed using a metal film containing Cu as a main body, and the third layer, which is the uppermost wiring layer of the multilayer wiring may be formed using an Al wiring.

A monolayer film, for example, a silicon oxide film, a silicon nitride film, or the like, or a surface protection film (a protection film or an insulating film) 10 made of a stacked film in which a silicon nitride film is provided on a silicon oxide film is formed as a final passivation film on a top of the third-layer Al wiring 9 which is the uppermost wiring layer of the multilayer wiring. Further, the third-layer Al wiring 9 as the uppermost wiring layer, which is exposed to a bottom portion of a pad opening (opening) 10a formed in the surface protection film 10 configures the pad (the electrode pad, the first electrode pad) 9a which is an Al pad. It is essential to use an inorganic insulating film as the surface protection film 10. In the case of using an organic insulating film as the surface protection film 10, the pad opening 10a increases in size, which is not suitable for the miniaturization. It is possible to acquire the miniaturization by using the inorganic insulating film as the surface protection film 10.

The third-layer Al wiring 9 configures not only the pad 9a but also, for example, a wiring formed to be integrated with the pad 9a, a wiring which is not connected to the pad 9a or the like. The wiring which is not connected to the pad 9a electrically connects the semiconductor elements or the circuits, and is used as a wiring that configures the semiconductor integrated circuit.

The rewiring 12, which is electrically connected to the pad 9a via the pad opening 10a of the surface protection film 10, is formed on the surface protection film 10. The rewiring 12 is formed inside the pad opening 10a so as to completely fill the pad opening 10a, and further, extends on the surface protection film 10.

An underlying metal film 11 is interposed between the pad 9a and the rewiring 12. The underlying metal film 11 is in contact with the pad 9a to be electrically connected, and is formed along a side surface (side wall) and an upper surface of the surface protection film 10 in the pad opening 10a of the surface protection film 10. The underlying metal film 11 has an upper surface and a lower surface, the upper surface is in contact with the rewiring 12, and the lower surface is in contact with the pad 9a and the surface protection film 10. The underlying metal film 11 is made of a stacked film having a chromium film as a lower layer and a copper seed film as an upper layer.

In addition, the rewiring 12 has an upper surface, a lower surface and a side surface, and the lower surface of the rewiring 12 is in contact with the upper surface of the underlying metal film 11. The rewiring 12 is formed in a stacked structure including a copper plating film 12a having copper (Cu) as a main component and a nickel plating film 12b on the copper plating film 12a. In addition, there is also a case in which the rewiring 12 is referred while also including the underlying metal film 11. In addition, the rewiring 12 may be configured only of the copper plating film 12a. Accordingly, the lower surface of the rewiring 12 means a lower surface of the copper plating film or the lower surface of the underlying metal film 11, and the upper surface means an upper surface of the nickel plating film or an upper surface of the copper plating film. In addition, the side surface (side wall) of the rewiring 12 means a side surface of the stacked structure including the copper plating film 12a and the nickel plating film 12b, or a side surface of a stacked structure including the underlying metal film 11, the copper plating film 12a and the nickel plating film 12b. Film thicknesses of the underlying metal film 11 and the copper plating film are 250 nm and 6 μm respectively, and a film thickness of the nickel plating film 12b is about 3 μm. Meanwhile, a film thickness of the third-layer Al wiring 9 is 400 nm to 600 nm, and thus, the rewiring 12 is a wiring with a low resistance having the film thickness ten or more times the film thickness of the third-layer Al wiring 9, that is, the wiring 9 on which the pad 9a is formed. That is, the film thickness of the rewiring 12 is also larger than the film thickness of the wiring 9 on which the pad 9a is formed. Preferably, the film thickness of the rewiring 12 is five times or more, and more preferably, ten or more times the film thickness of the wiring 9 on which the pad 9a is formed.

The copper seed film of the underlying metal film 11 is a film configured to form the copper plating film 12a using an electrolytic plating method, and the chromium film is a film configured to prevent the copper included in the copper plating film 12a from diffusing in the surface protection film 10. The nickel plating film 12b is provided to prevent oxidation of a front surface (the upper surface) of the copper plating film 12a.

The pad electrode 13 is formed in contact with the upper surface and the side surface of the rewiring 12, and completely covers the pad electrode mounting portion 121 of the rewiring 12. The pad electrode 13 is formed in a stacked structure including a nickel thin film 13a and a gold thin film 13b on the nickel thin film 13a. The nickel thin film 13a is provided to improve adhesiveness between the rewiring 12 and the pad electrode 13, and a film thickness thereof is about 0.5 μm. The gold thin film 13b is provided to improve adhesiveness between a wire 20 to be described later and the pad electrode 13, and a film thickness thereof is about 2 μm.

<Method of Manufacturing Semiconductor Device>

Next, a description will be given regarding a method of manufacturing the semiconductor device according to the present embodiment by focusing on a method of manufacturing the rewiring which is a characteristic of the embodiment. The method of manufacturing the rewiring corresponds to the cross-section illustrated in FIG. 3.

Figure 4:
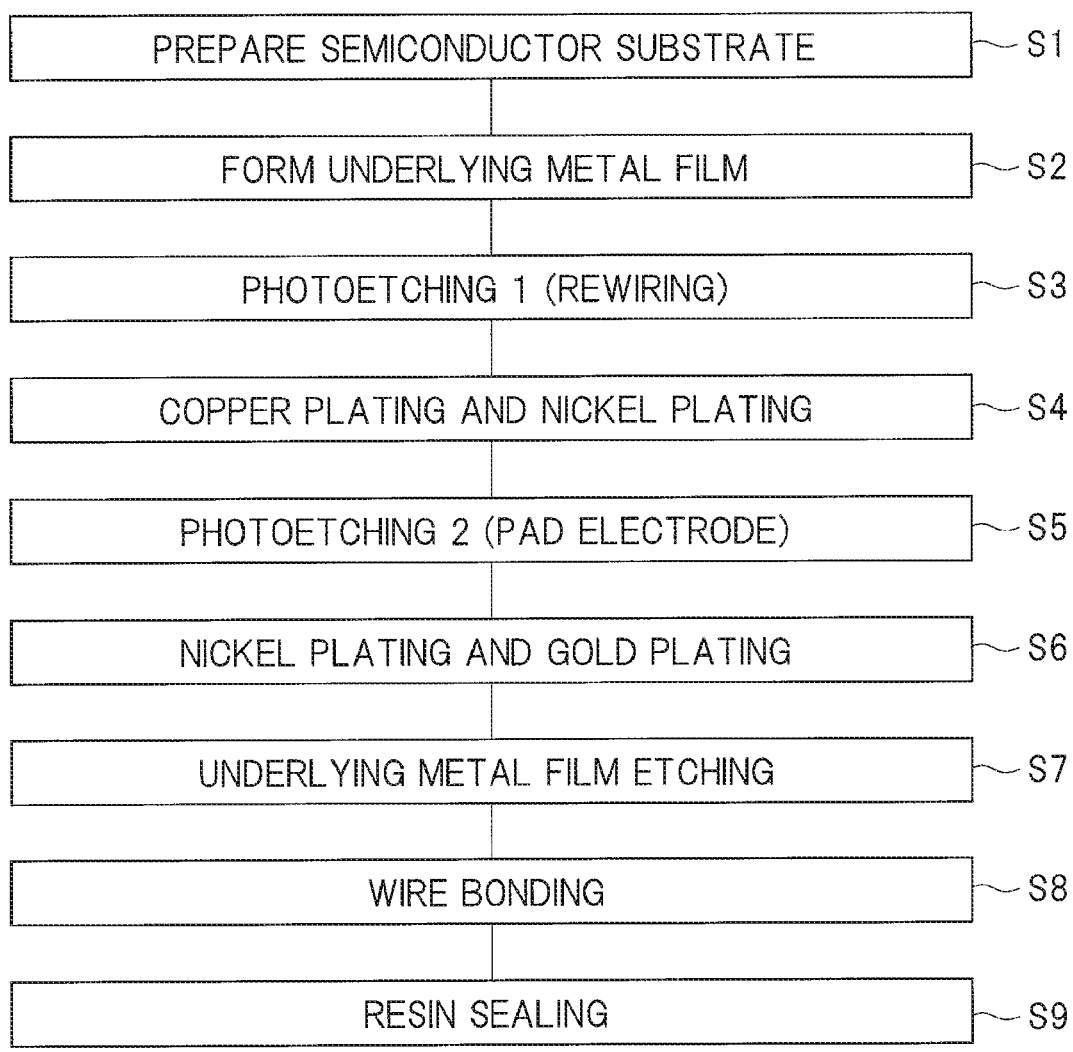
FIG. 4 is a process flow chart of a manufacturing process of the semiconductor device according to the embodiment.

FIG. 4 is a process flow chart illustrating a part of the manufacturing process of the semiconductor device according to the present embodiment. FIGS. 5 to 9 and 11 are cross-sectional views during the manufacturing process of the semiconductor device according to the present embodiment. FIG. 10 is a plan view during the manufacturing process of the semiconductor device according to the present embodiment.

Figure 5:
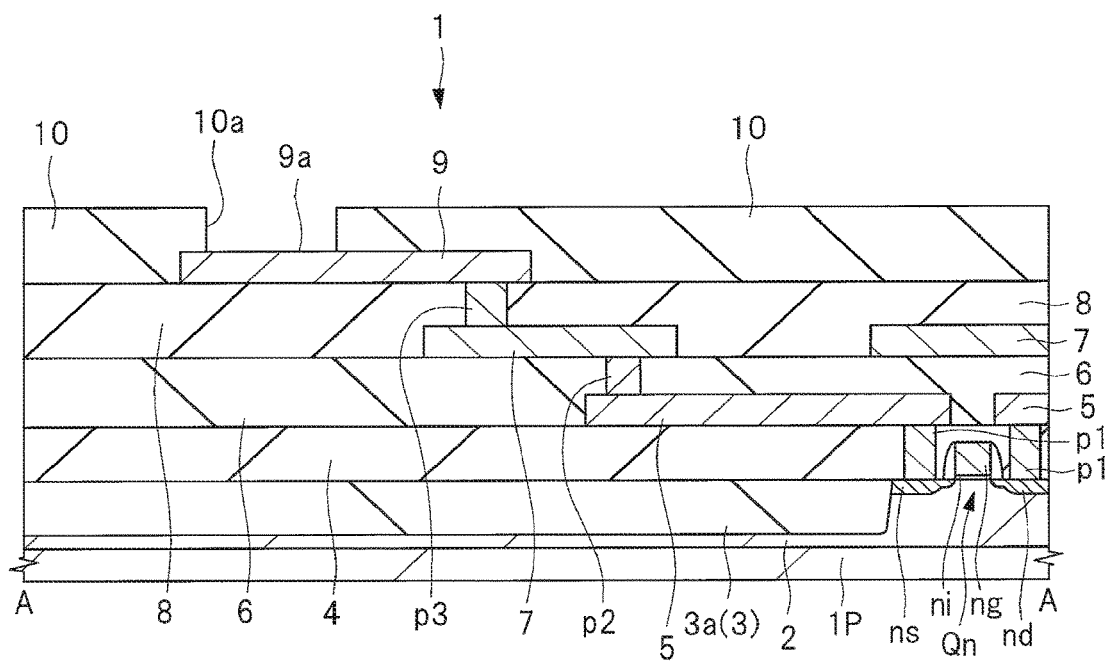
FIG. 5 is a cross-sectional view during the manufacturing process of the semiconductor device according to the embodiment.

FIG. 5 is a diagram to describe a "semiconductor substrate preparing" process (Step S1) in the process flow chart illustrated in FIG. 4, and illustrates the process of preparing the semiconductor substrate 1P in which the plurality of wiring layers and the pad 9a are formed. The n-channel MIS transistor (Qn) is formed in the semiconductor substrate 1P, and then, the wiring including the plurality of wiring layers is formed therein. To be specific, the wiring layers of the three layers (the first-layer Al wiring 5, the second-layer Al wiring 7, and the third-layer Al wiring 9) are formed as described in FIG. 3. Further, the surface protection film 10 is formed on the top of the third-layer Al wiring 9, and the surface protection film 10 has the pad opening 10a, so that a part of the third-layer Al wiring 9, which is the uppermost wiring layer, exposed from the pad opening 10a forms the pad 9a. A cross-sectional structure illustrated in FIG. 5 is the same as the structure that has been described with reference to FIG. 3.

Figure 6:
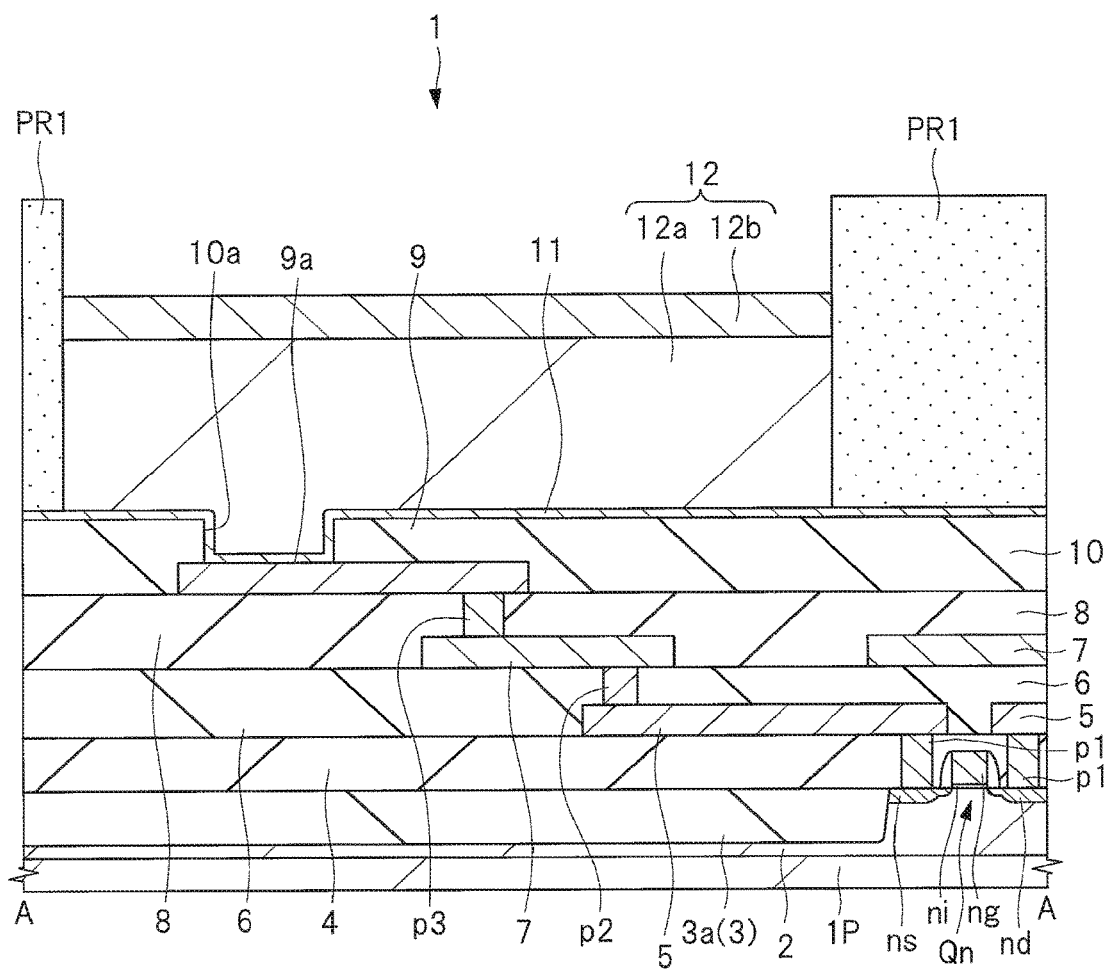
FIG. 6 is a cross-sectional view during the manufacturing process of the semiconductor device subsequent to FIG. 5.

FIG. 6 is a diagram to describe an "underlying metal film forming" process (Step S2), a "photoetching 1 (the rewiring)" process (Step S3), and a "copper plating and nickel plating" process (Step S4) in the process flow chart illustrated in FIG. 4. First, the underlying metal film 11, which is electrically connected to the pad 9a via the pad opening 10a, is formed (deposited) on the surface protection film 10 using a sputtering method in the "underlying metal film forming" process (Step S2). The film thickness of the chromium film configuring the underlying metal film 11 is set to 50 nm, and the film thickness of the copper seed film configuring the same is set to 200 nm. Next, a region to form the rewiring 12 is opened on the underlying metal film 11, and a resist film PR1, which has a pattern to cover the other region, is formed thereon, in the "photoetching 1 (the rewiring)" process (Step S3). Of course, the pad 9a is positioned at the opening portion of the resist film PR1. Further, the copper plating film 12a and the nickel plating film 12b are sequentially formed in the opening portion of the resist film PR1 using the electrolytic plating method with the underlying metal film 11 as a seed electrode in the "copper plating and nickel plating" process (Step 4).

Figure 7:
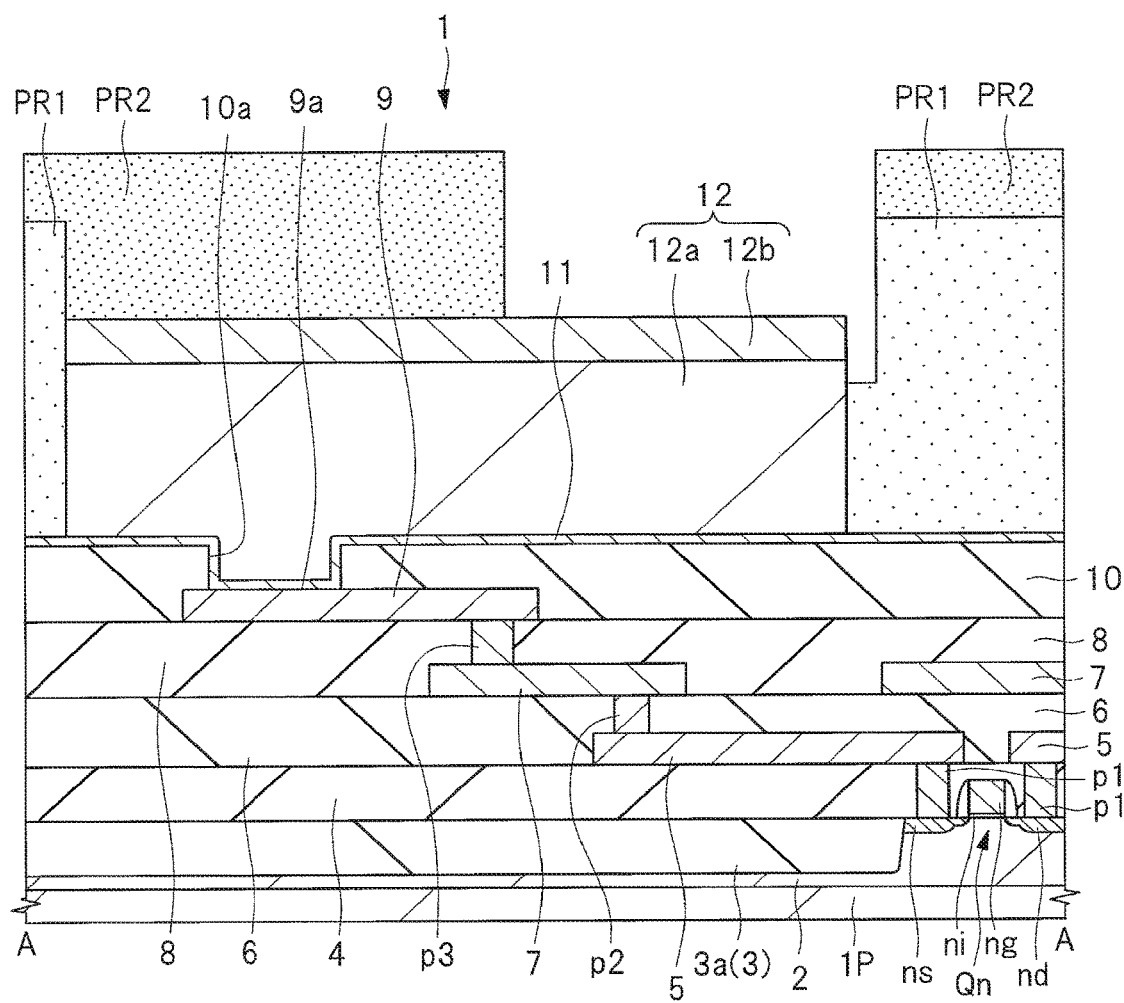
FIG. 7 is a cross-sectional view during the manufacturing process of the semiconductor device subsequent to FIG. 6.

FIG. 7 is a diagram to describe a "photoetching 2 (the pad electrode)" process (Step S5) in the process flowchart illustrated in FIG. 4. A region to form the pad electrode 13 is opened on the resist film PR1, and a resist film PR2, which has a pattern to cover the other region, is formed thereon. The resist film PR2 has the pattern to expose the side wall of the rewiring 12, and thus, a part of the resist film PR1 that has covered the side wall of the rewiring 12 in Step S3 is removed.

Figure 8:
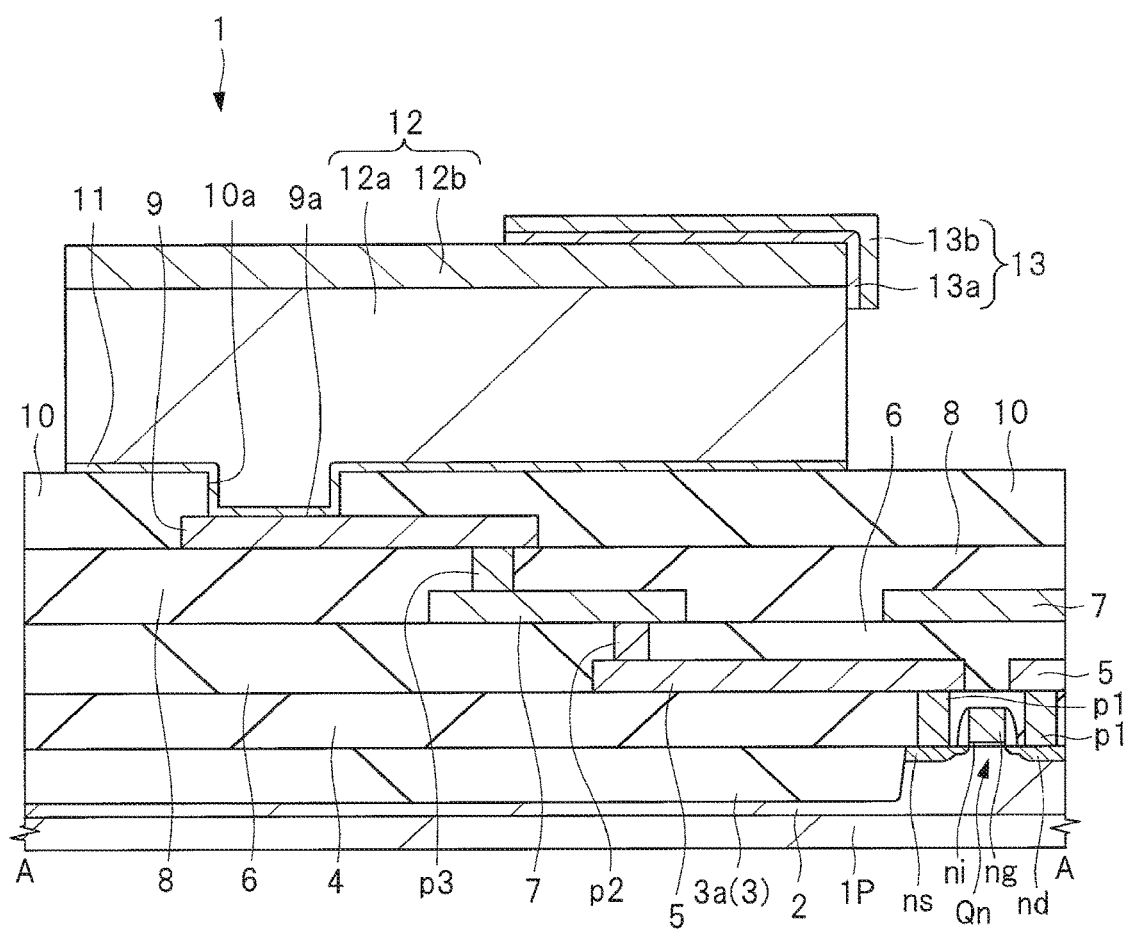
FIG. 8 is a cross-sectional view during the manufacturing process of the semiconductor device subsequent to FIG. 7.

FIG. 8 is a diagram to describe a "nickel plating and gold plating" process (Step S6) and an "underlying metal film etching" process (Step S7) in the process flow chart illustrated in FIG. 4. In the "nickel plating and gold plating" process (Step S6), the nickel thin film 13a and the gold thin film 13b are sequentially formed in the opening portion of the resist film PR1 and PR2 using the electrolytic plating method. Further, the resist films PR1 and PR2 are removed, and then, the underlying metal film 11 in a region exposed from the rewiring 12 is removed, so that the underlying metal film 11 is selectively left only in a lower part of the rewiring 12. In other words, the region exposed from the rewiring 12 is a region at an outer side of the rewiring 12, that is, a region in which the rewiring 12 is not formed. In this manner, the pad electrode 13 and the rewiring 12 are completed.

Figure 9:
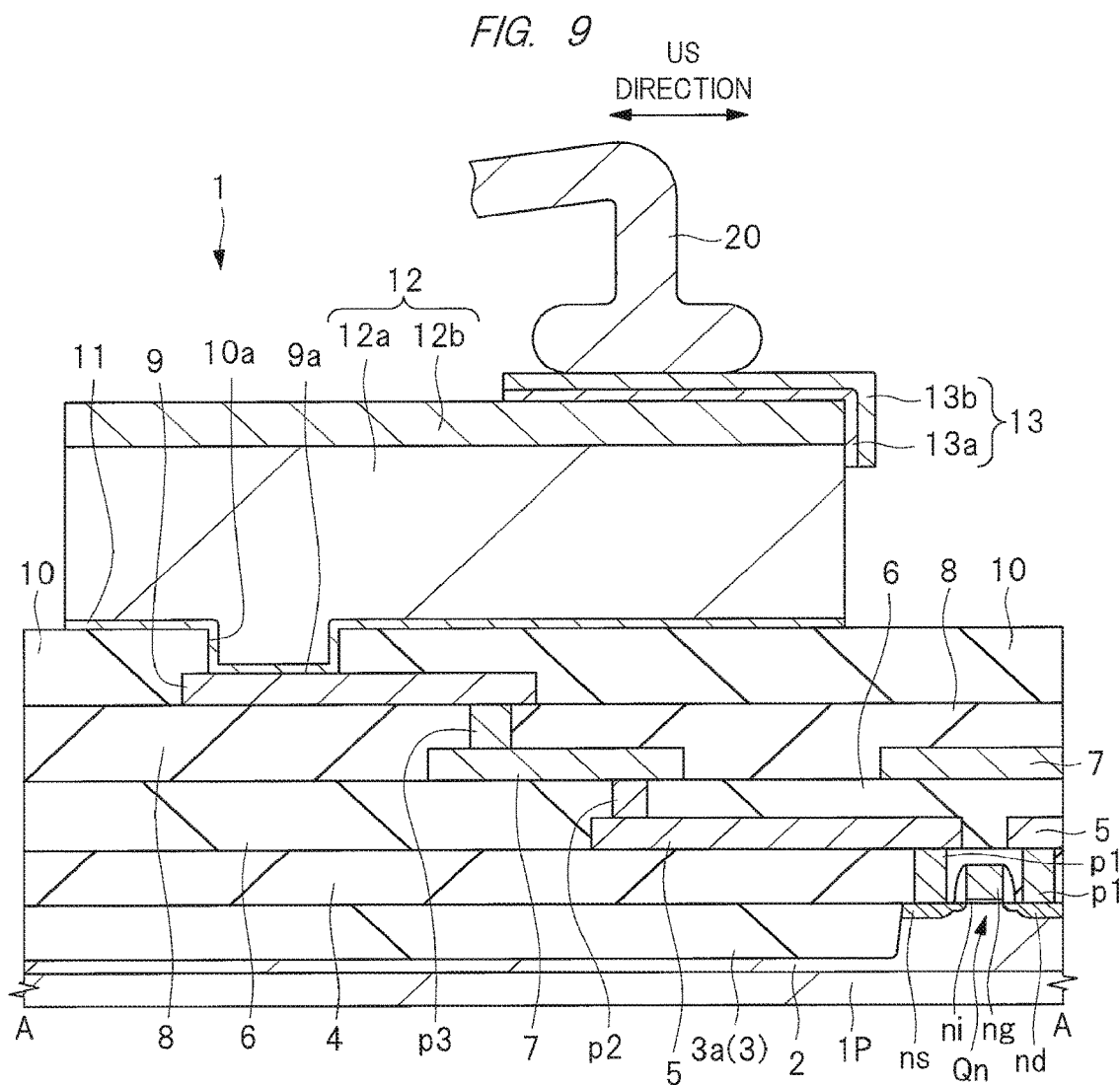
FIG. 9 is a cross-sectional view during the manufacturing process of the semiconductor device subsequent to FIG. 8.
Figure 10:
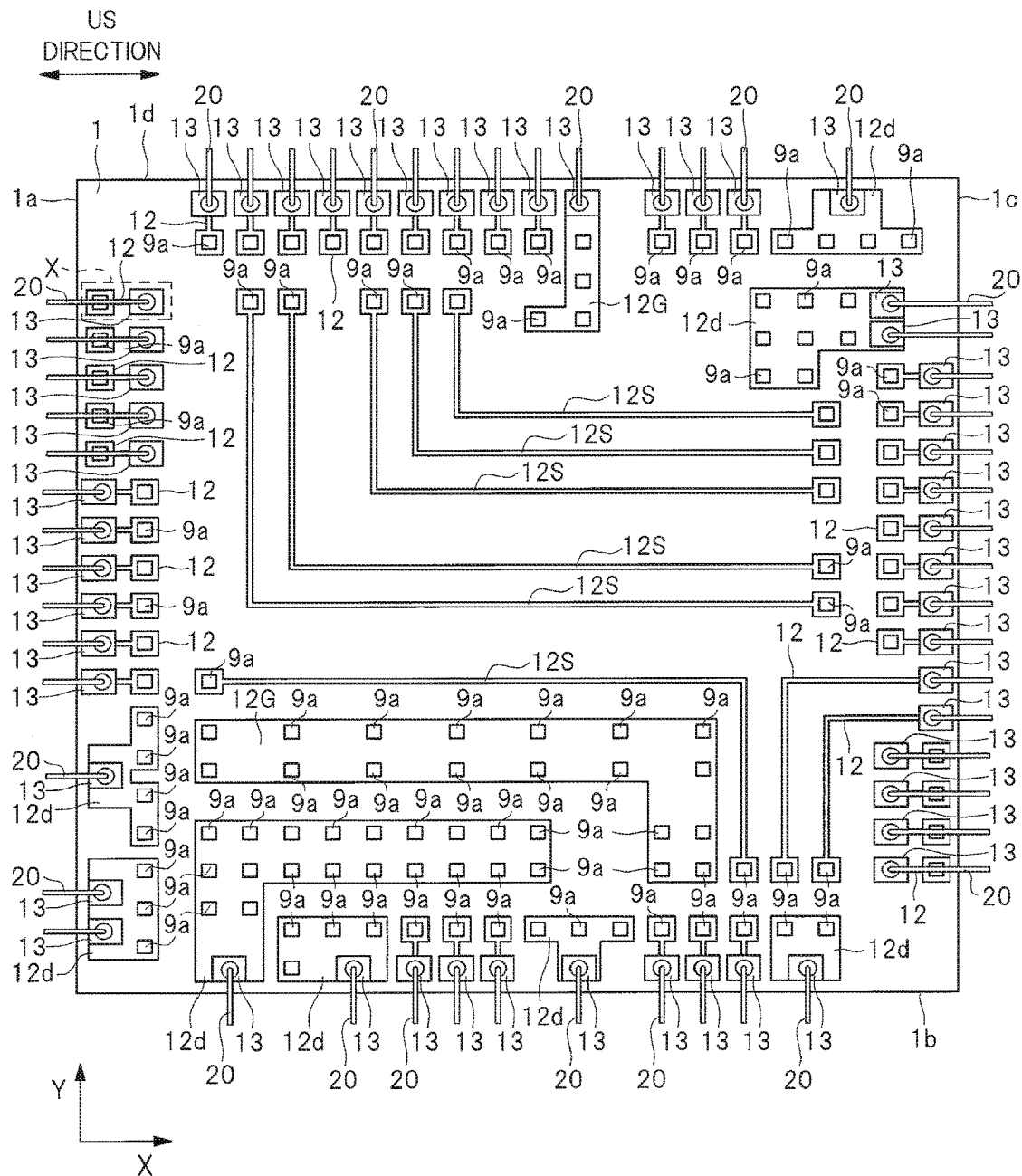
FIG. 10 is a plan view during the manufacturing process of the semiconductor device according to the embodiment.

FIG. 9 is a diagram to describe the "wire bonding" process (Step S8) in the process flow chart illustrated in FIG. 4. In the "wire bonding" process (Step S8), the wire 20 is connected to a front surface of the pad electrode 13 (that is, a front surface of the gold thin film 13b) using the ultrasonic ball bonding method. The ball is formed at the tip end of the wire 20, and the ball is connected to the pad electrode 13 while applying the ultrasonic vibration in the lateral direction the of the drawing sheet of FIG. 9 and applying the pressing force in the vertical direction to the main surface of the pad electrode 13 with respect to the ball. The wire 20 contains copper as a main component, and may contain a trace amount of additive or the like. In addition, a coated wire, which is obtained by coating a surface of a copper wire with a palladium film or the like, may be used.

As illustrated in FIG. 10, the wire 20 connected to each of the pad electrodes 13 crosses the sides 1a, 1b, 1c and 1d on which the respective pad electrodes 13 are arranged, and extends to an outer side of the semiconductor chip 1.

Figure 11:
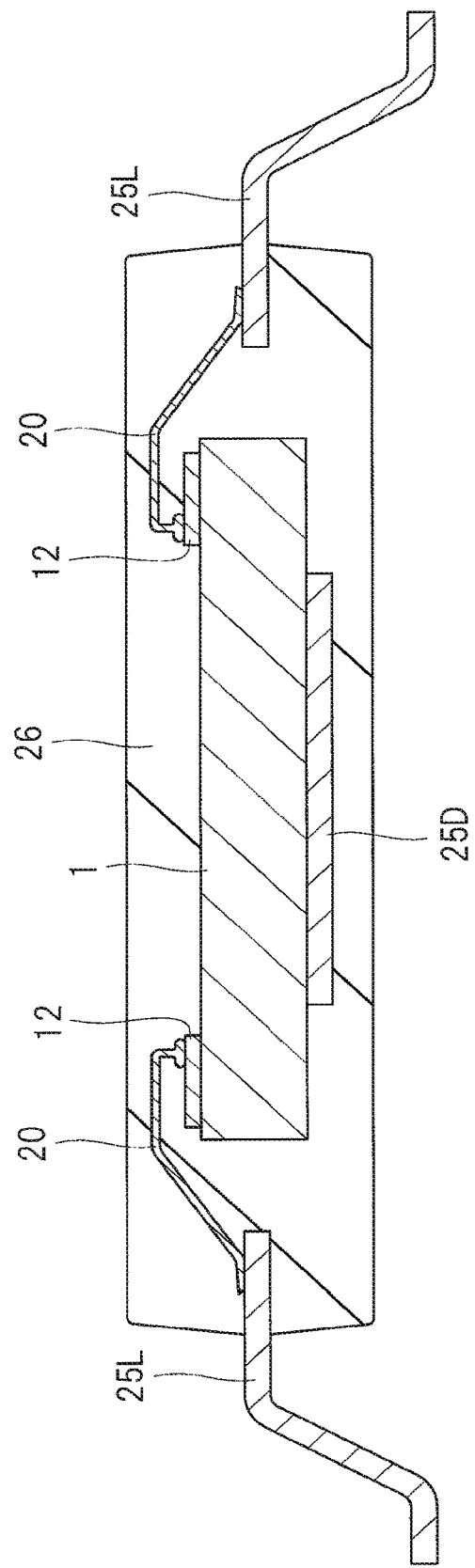
FIG. 11 is a cross-sectional view during the manufacturing process of the semiconductor device subsequent to FIG. 9.

FIG. 11 is a diagram to describe a "resin sealing" process (Step S9) in the process flow chart illustrated in FIG. 4. As illustrated in FIG. 11, the semiconductor chip 1 including the plurality of rewirings 12 is mounted on a die pad portion 25D and is electrically connected to a plurality of leads 25L via the wires 20. A part (inner lead portion) of the lead 25L, the die pad portion 25D, the semiconductor chip 1 and the wire 20 are sealed by, for example, a thermosetting epoxy resin or the like, thereby forming a sealing body (sealing resin) 26. The lead 25L includes an outer lead portion (the external terminal described above) which extends to the outside of the sealing body 26 from the inner lead portion (the internal terminal described above) covered by the sealing body 26. There is a case in which the semiconductor chip 1 sealed by the sealing body 26 in such a manner is also referred to as the semiconductor device (semiconductor integrated circuit device). In the present embodiment, the rewiring 12 and the pad electrode 13 are in direct contact with the sealing body 26, but a polyimide resin or the like may be interposed between the rewiring 12 or the pad electrode 13 and the sealing body 26.

<Characteristics of Semiconductor Device and Method of Manufacturing the Same>

Hereinafter, a description will be given regarding main characteristics of the semiconductor device according to the present embodiment and the method of manufacturing the same.

Since the stress that the surface protection film 10 receives is mitigated in the "wire bonding" process by forming the pad electrode mounting portion 121 of the pad electrode 13 and the rewiring 12 in the rectangular shape to increase the pad electrode 13 and the pad electrode mounting portion 121 in size, it is possible to reduce damage on the front surface of the surface protection film 10, and it is possible to prevent the rewiring 12 from peeling off from the surface protection film 10. That is, it is possible to improve the reliability of the semiconductor device.

In the present embodiment, it is essential to form the pad electrode 13 and the pad electrode mounting portion 121 in the rectangular shapes in a case in which the pad electrode mounting portion 121 is substantially equal to the pad electrode 13 when seen in a plan view. In addition, the pad electrode 13 is not necessarily formed in the rectangular shape, but may be formed in a square in a case in which the pad electrode mounting portion 121 is wider (larger) than the pad electrode 13. That is, only the pad electrode mounting portion 121 may be formed in the rectangular shape, and the pressing force to be applied to the pad electrode 13 is received by the pad electrode mounting portion 121 which is wider (larger) than the pad electrode 13, and thus, it is possible to reduce a pressing force per unit area, and it is possible to prevent the rewiring 12 from peeling off from the surface protection film 10.

Although the long side 121x of the rectangular pad electrode mounting portion 121 is aligned in the application direction (the US direction) of the ultrasonic wave in the present embodiment, the long side 121x of the entire rectangular pad electrode mounting portion 121 may be disposed in a direction orthogonal to the US direction. In addition, the long sides 121x of some of the pad electrode mounting portions 121 may be formed to match the US direction, and the long sides 121x of the other pad electrode mounting portions 121 may be disposed in the direction orthogonal to the US direction. For example, the long side 121x of the pad electrode mounting portion 121 in which the pad electrode 13 disposed along the sides 1a and 1c of the semiconductor chip 1 is formed may be formed to match the US direction, and the long side 121x of the pad electrode mounting portion 121 in which the pad electrode 13 disposed along the sides 1b and 1d is formed may be disposed in the direction orthogonal to the US direction. According to such a configuration, it is possible to increase the number of the rewirings 12 to be disposed along the sides 1b and 1d.

Since the pad electrode mounting portion 121 of the pad electrode 13 and the rewiring 12 is formed in the rectangular shape, the wire connection portion is not deviated to a position reaching the end portion of the pad electrode 13 even when the wire connection portion is somewhat deviated from the center of the pad electrode 13. Accordingly, the adhesion strength between the rewiring 12 and the surface protection film 10 is firmly maintained in the periphery of the wire connection portion, and thus, it is possible to prevent the peeling-off of the rewiring 12 even when the wire 20 receives the tensile stress.

It is possible to acquire the miniaturization of the semiconductor device since the rewiring 12 is formed directly on the surface protection film 10 made of the inorganic insulating film without using the organic insulating film.

<Modification Example>

Figure 12:
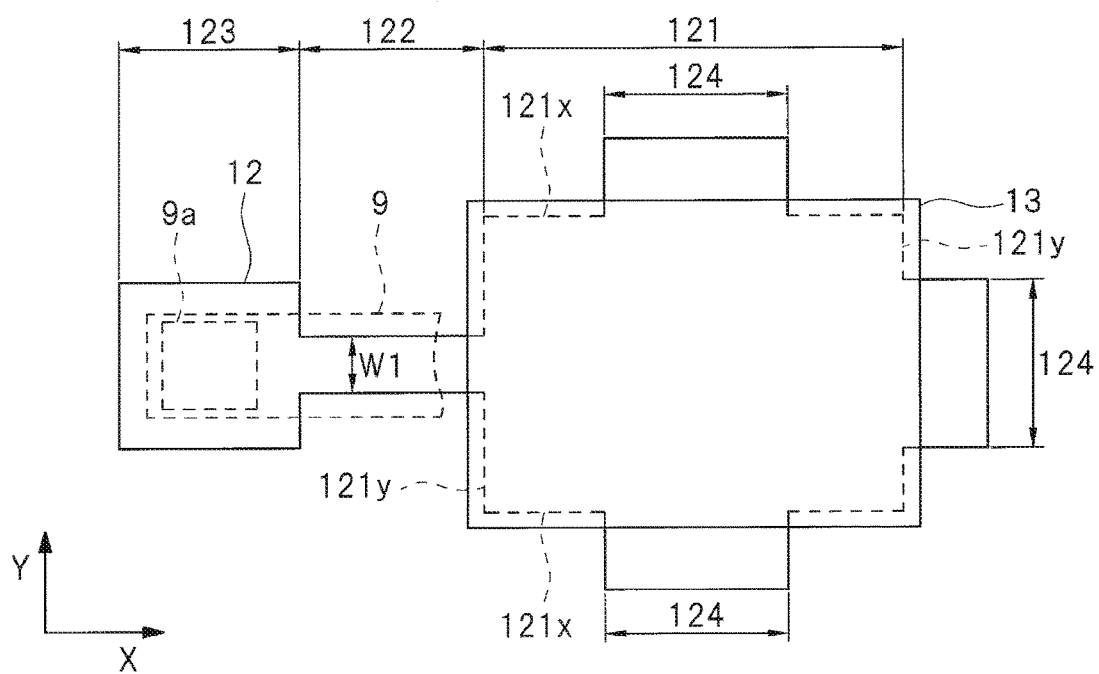
FIG. 12 is a plan view of main parts of a semiconductor device which is a modification example.

FIG. 12 is a plan view of main parts of a semiconductor device which is a modification example of the embodiment described above.

The modification example is an example in which fin portions are provided on the long side and the short side of the rewiring 12 described in FIG. 2 of the embodiment described above.

As illustrated in FIG. 12, fin portions 124 are formed on three sides except for the short side 121y to which the extended wiring portion 122 is connected, among the two long sides 121x and the two short sides 121y forming the rectangular shape of the rewiring 12. The fin portions 124 protrude to an outer side of the pad electrode mounting portion 121 from the long side 121x and the short side 121y of the pad electrode mounting portion 121. The fin portion 124 is a part of the rewiring 12. A part of the fin portion 124 is covered by the rectangular pad electrode 13, but the other part thereof is exposed from the pad electrode 13. Similarly to the embodiment, the pad electrode 13 covers the side surface of the rewiring 12 except for parts to which the extended wiring portion 122 and the fin portion 124 are connected in the pad electrode mounting portion 121.

The pad 9a of the wiring 9 of the lower layer is not disposed below the fin portion 124, and the entire region of the fin portion 124 is in contact with the surface protection film 10.

The fin portion 124 is not limited to the case of being provided on the three sides, but may be provided only on one of the long sides 121x or one of the short sides 121y of the pad electrode mounting portion 121 or may be provided only on one of the long sides 121x and one of the short sides 121y.

According to the modification example, it is possible to increase an adhesion region between the rewiring 12 and the surface protection film 10 by providing the fin portion 124 in the pad electrode mounting portion 121. In addition, the pressing force to be applied to the pad electrode 13 is received by the pad electrode mounting portion 121 which is wider (larger) than the pad electrode 13 at the time of wire bonding, and thus, it is possible to reduce the pressing force per unit area, and it is possible to prevent the rewiring 12 from peeling off from the surface protection film 10.

The modification example may have a structure in which the pad electrode mounting portion 121 is formed in a square, and the fin portion 124 is provided therein.

In addition, the fin portion 124 may be provided in the pad electrode mounting portion 121 having a rectangular shape, and the pad electrode 13 having a square shape may be disposed at a central portion of the pad electrode mounting portion 121. In this case, the pad electrode 13 is smaller than the pad electrode mounting portion 121, and does not reach the side wall of the rewiring 12.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A method of manufacturing a semiconductor device, the method comprising:
   (a) preparing a semiconductor substrate which includes a plurality of wiring layers and a pad formed on an uppermost wiring layer of the plurality of wiring layers;
   (b) forming a surface protection film which includes an opening on the pad and is made of an inorganic insulating film;
   (c) forming a rewiring, which is electrically connected to the pad via the opening, on the surface protection film;
   (d) forming a pad electrode on the rewiring; and
   (e) forming a ball at a tip end of a wire, and connecting the ball to the pad electrode while applying ultrasonic vibration to the ball in a first direction,
   wherein the rewiring includes a pad electrode mounting portion on which the pad electrode is mounted, a connection portion which is connected to the pad, and an extended wiring portion that couples the pad electrode mounting portion and the connection portion,
   the pad electrode mounting portion has a rectangular shape with long sides and short sides,
   the rewiring includes a fin portion that extends beyond the pad electrode in plan view,
   the fin portion is coupled to the pad electrode mounting portion at one of the long sides and the short sides, except for the short side to which the extended wiring portion is coupled, and
   in plan view, a first part of the fin portion is covered by the pad electrode and a second part of the fin portion is exposed from the pad electrode.

2. The method of manufacturing the semiconductor device according to claim 1,
   wherein the first direction is a direction along one of the long sides.

3. The method of manufacturing the semiconductor device according to claim 2,
   wherein the pad electrode covers a front surface of the pad electrode mounting portion, and extends to a side wall of the pad electrode mounting portion.

4. The method of manufacturing the semiconductor device according to claim 1,
   wherein the first direction is a direction along one of the short sides.

5. A method of manufacturing a semiconductor device, the method comprising:
   (a) preparing a semiconductor substrate which includes a plurality of wiring layers and a pad formed on an uppermost wiring layer of the plurality of wiring layers;
   (b) forming a surface protection film which includes an opening on the pad and is made of an inorganic insulating film;
   (c) forming a rewiring, which is electrically connected to the pad via the opening, on the surface protection film;
   (d) forming a pad electrode on the rewiring; and
   (e) forming a ball at a tip end of a wire, and connecting the ball to the pad electrode while applying ultrasonic vibration to the ball in a first direction,
   wherein the rewiring includes a pad electrode mounting portion on which the pad electrode is mounted, a connection portion which is connected to the pad, and an extended wiring portion that couples the pad electrode mounting portion and the connection portion,
   wherein the pad electrode mounting portion has a rectangular shape with long sides and short sides,
   the rewiring includes a plurality of fin portions that extend beyond the pad electrode in plan view,
   each fin portion is coupled to the pad electrode mounting portion at one of the long sides and the short sides, except for the short side to which the extended wiring portion is coupled,
   a first of the fin portions is coupled to the pad electrode mounting portion at one of the long sides,
   a second of the fin portions is coupled to the pad electrode mounting portion at another of the long sides, and
   a third of the fin portions is coupled to one of the short sides that is opposite from the short side to which the extended wiring portion is coupled.

* * * * *